United States Patent
Yokawa et al.

[19]

[11] Patent Number: 5,833,610
[45] Date of Patent: Nov. 10, 1998

[54] MAGNETIC RESONANCE IMAGING OF CEREBRAL BLOOD FLOW AND DIAGNOSIS OF DIABETES

[75] Inventors: Takashi Yokawa, Toyama; Kunio Torii, Tokyo, both of Japan

[73] Assignee: Research Development Corporation of Japan, Saitama, Japan

[21] Appl. No.: 696,461

[22] Filed: Aug. 14, 1996

[30] Foreign Application Priority Data

Aug. 31, 1995 [JP] Japan ................................. 7-224185

[51] Int. Cl.⁶ ................................................. A61B 5/055
[52] U.S. Cl. ...................... 600/419; 324/307; 324/309
[58] Field of Search .......................... 128/653.2, 653.3; 324/307, 309, 306; 600/410, 419

[56] References Cited

U.S. PATENT DOCUMENTS

| 4,875,486 | 10/1989 | Rapoport et al. | 128/653 |
| 5,072,732 | 12/1991 | Rapoport et al. | 128/643.2 |
| 5,459,400 | 10/1995 | Moonen | 324/309 |
| 5,597,548 | 1/1997 | Sherry et al. | 424/9.3 |

*Primary Examiner*—Marvin M. Lateef
*Assistant Examiner*—Eleni Mantis Mercader
*Attorney, Agent, or Firm*—Wenderoth, Lind & Ponack, L.L.P.

[57] ABSTRACT

A method of magnetic resonance imaging of cerebral blood flow uses a pulse sequence of a rapid gradient-echo method, wherein the pulse is an RF pulse having a slice gradient, a read gradient and a phase-encode gradient. The RF pulse is provided with a flip angle of between 45 and 60 degrees, and an additional gradient is added to each of the slice gradient, read gradient and phase-encode gradient, thereby diffusing and refusing proton spin in the cerebral blood flow. Very slight changes in the blood flow in the brain can be imaged and diabetes can be diagnosed by detecting the increase in the blood flow in a specific brain region after systemic administration of insulin.

2 Claims, 3 Drawing Sheets

MAGNETIC RESONANCE IMAGING OF CEREBRAL BLOOD FLOW AND DIAGNOSIS OF DIABETES

FIELD OF THE INVENTION

The present invention relates to magnetic resonance imaging of cerebral blood flow and diagnosis of diabetes. More particularly, the present invention relates to a functional magnetic resonance imaging method which specifies the brain activation sites with changes in cerebral blood flow as an indicator. The present invention also relates to a novel method of diagnosing diabetes using the functional magnetic resonance imaging method.

DESCRIPTION OF RELATED ART

For human sense and movement, homeostasis, and various higher functions such as emotion, memory, language and thinking, there are often control mechanisms for each specific site or region in the brain. Such localization of functions in the brain had been confirmed by observing, in detail, changes in behavior of patients suffering from regional damage to the brain caused by trauma or cerebral blood vessel impediment, or states of epileptic attack, and by estimating the function of the damaged region. In addition, the results of local electric stimulus experiments to the cerebral cortex had provided important evidence of localization of various functions in the brain.

On the other hand, the recent rapid progress made in the areas of electronic engineering technology and image processing technology has urged achievement of new brain tissue imaging methods such as computer tomography (CT), positron emmision tomography (PET) and magnetic resonance imaging (MRI) and apparatuses for the application of these new methods. These apparatuses and methods have made it possible to easily diagnose focal regions which have so far been confirmed only through autoptic or operative findings. Furthermore it is now possible to study localization of brain functions of sound subjects without applying any medicament.

Among others, MRI is widely applied in clinical medicine because of its the capability of clearly depicting the slightest tissue of human brain in vivo. More recently, a method known as the functional MRI (hereinafter sometimes abbreviated as "fMRI") was developed, which images actual activation regions of the brain. The fMRI is attracting the general attention as a means for research on cerebral and neural mechanisms and a new means for brain diagnosis.

This fMRI utilizes the findings that the local blood flow is increased at the activated brain regions where neurons are being excited. In the area of MRI technology, including fMRI, various contrivances are being made in electromagnetic pulse systems for irradiation onto the brain. Commonly known methods include the inversion recovery (IR) method, the gradient-echo (GE) method and the spin-echo (SE) method.

From among these new methods, the GE method has developed as a method for measuring the blood flow rate and the oxygenation status of hemoglobin in blood. More specifically, oxy-hemoglobin transports oxygen to brain and other tissues of the entire body. Oxygen, fed from the lung into blood, is sent in the form of oxy-hemoglobin through arteries to the brain and other tissues. Hemoglobin, having cut off oxygen, transforms into deoxy-hemoglobin and goes back to the heart through veins. Because of its properties as a paramagnetic substance, the deoxy-hemoglobin disturbs the static magnetic field, thereby impairing an MRI signal.

The conventional GE method, $T2^*$-weighted image with long echo time, has been used to image oxygen consumption. In this method, however, the signal intensity is affected by the fluctuation of cerebral blood flow, which makes it difficult to specify the activation site. To overcome this difficulty, a method for determining the presence of only deoxy-hemoglobin, excluding the influence of fluctuation of the blood flow, was developed to improve the conventional GE method, and is now accepted as a more accurate method to analyze brain functions.

However, the improved GE method, free from the effect of blood flow requires, in practice, prior administration of a contrast medium or use of a high magnetic-field pulse not allowed for medical purposes, because of the very low sensitivity. There is another problem of unavailability of a clear image since the MRI signal is strongly affected by a disturbance of the static magnetic field.

SUMMARY OF THE INVENTION

The present invention has an object to provide an improved method of fMRI which permits clear imaging of even the slightest changes in the brain functions by determining the change in blood flow itself, but not in the blood oxygenation level.

Another object of the present invention is to provide a method for diagnosis of diabetes using an excited state of a specific brain site based on fMRI as an indicator.

The present invention provides, in a method of magnetic resonance imaging of cerebral blood flow using a pulse sequence of a rapid gradient-echo method, read gradient and phase-encoded gradient, wherein the pulse is an RF pulse having a slice gradient. The improvement includes giving the RF pulse with a relatively high flip angle of between 45 and 60 degrees, and adding an additional gradient, to each of the slice gradient, read gradient and phase-encode gradient, thereby diffusing and refusing proton spin in the cerebral blood flow.

The present invention also provides a diabetes diagnosing method which includes imaging the cerebral blood flow after administration of insulin by the above-described method, and detecting the increase in blood flow in any one of the hippocampus, paraventricular nucleus of the hypothalamus, dorsomedial nucleus of the hypothalamus, and ventromedial nucleus of the hypothalamus.

DETAILED DESCRIPTION OF THE INVENTION

Figure 1:
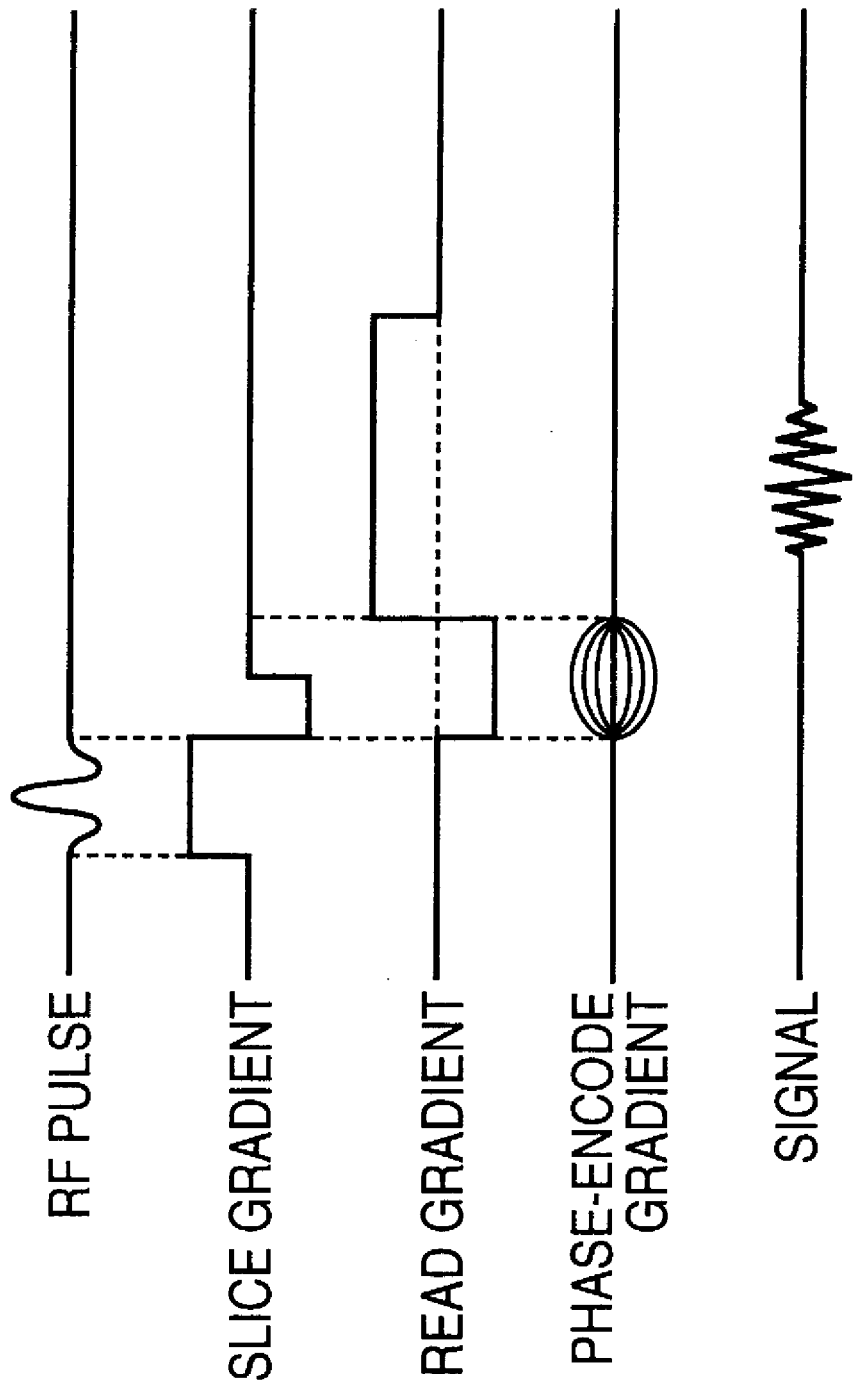
FIG. 1 is a schematic view illustrating the imaging pulse sequense in the conventional GE method.
Figure 2:
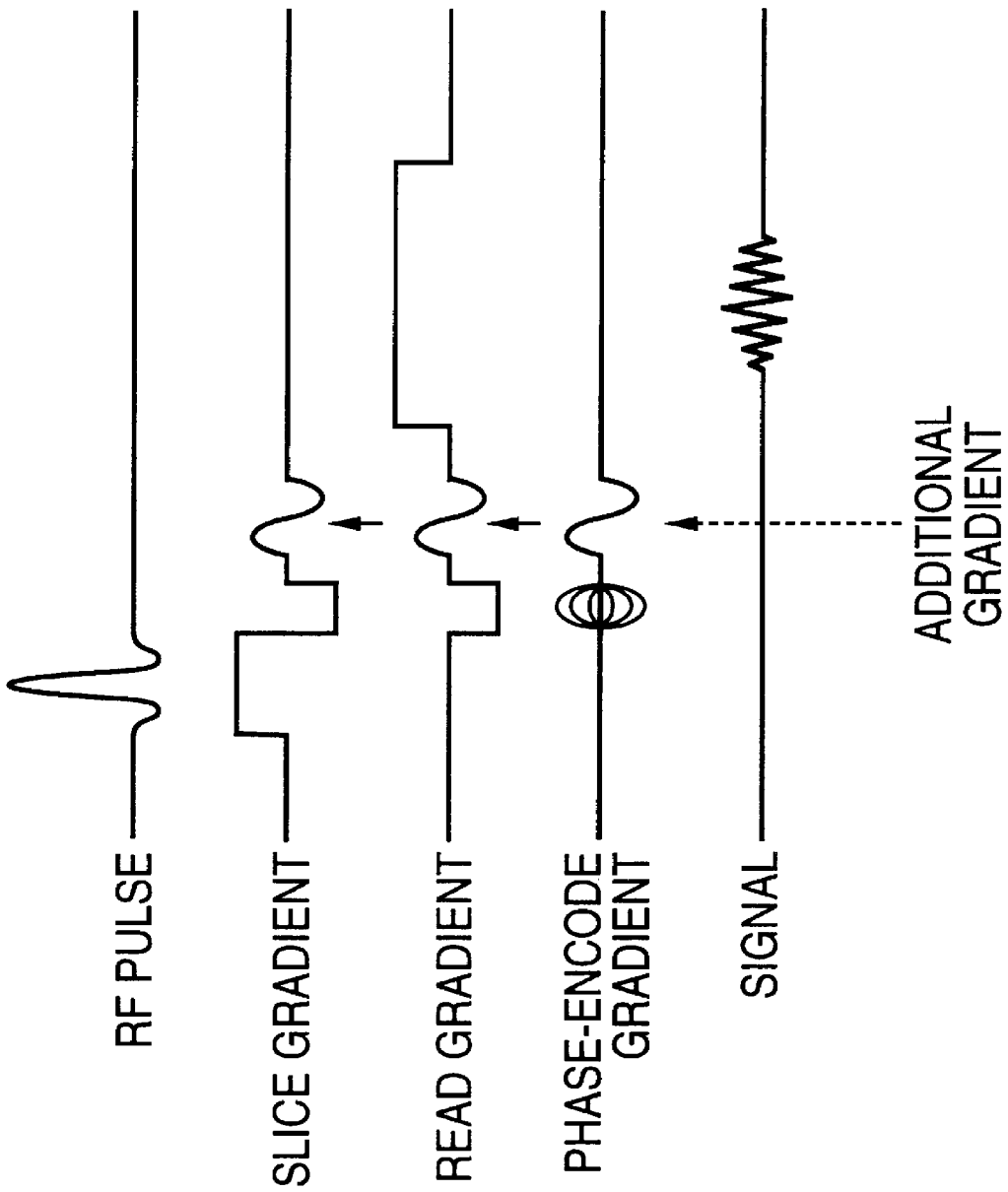
FIG. 2 is a schematic view illustrating the imaging pulse sequense in the method of the present invention.

The fMRI of the present invention provides an improvement of the rapid gradient-echo method (RGE method) in which changes in blood flow are emphasized for the purpose of imaging the activated region(s) of the brain. The ordinary RGE method uses, for example, an imaging pulse sequense. One pulse of such a sequence is schematically shown in FIG. 1. In the method of the present invention, in contrast, an additional gradient for diffusing and refusing proton spin is added to the pulse sequence as shown in FIG. 2._

While, in the RGE method, the ordinary RF pulse intensity is represented by a flip angle of between 5 and 30 degrees, in the method of the present invention, the RF pulse intensity is set at a flip angle of between 45 and 60 degrees.

By adopting the additional gradient and the RF pulse intensity as described above, it is possible to exclude the influence of a disturbance of a static magnetic field which is caused by the change in the concentration of deoxyhemoglobin. Thus it is possible to clearly image an activated region(s) using the change in blood flow as an indicator. Furthermore, an image can be aquired with a higher time resolution (about 5 seconds), and a simultaneous combination with a T2*-weighted image, a T1-weighted image, or a liquid diffusion weighted image, is also available.

The MRI method in the present invention makes it possible to clearly image a very slight change in brain function by determining the change of the local blood flow. This permits easy and sure diagnosis of diabetes with the change in the MRI signal for a specific region in the brain being used as an indicator.

As a result of imaging, by the foregoing fMRI method, a change in the cerebral blood flow upon administering insulin to a diabetic model animal, as shown in the example presented later, the present inventors observed an increase in the MRI signal intensity at the hippocampus, paraventricular nucleus of the hypothalamus, dorsomedial nucleus of the hypothalamus, and ventromedial nucleus of the hypothalamus, during the time after the administration of insulin. This result is attributable to the fact that the brain in a glucose starvation state suddenly reacts with glucose, thus increasing the blood flow to the brain regions as described above. It is therefore possible to diagnose the presence and progress of diabetes by imaging the blood flow patterns of the foregoing regions of the brain with the method of the present invention when administering insulin to a potential patient who may suffer from diabetes.

The present invention will be described in further detail below. The present invention is not limited by the following example.

EXAMPLE

Changes in cerebral blood flow of diabetic model animals after administration of insulin were measured using an MRI based on the method of the present invention.

Streptozotocin (STZ) was administered intraperitoneally in an amount of 60 mg/body weight to male Wistar rats (body weight: about 200 g), and most of the β-cells of the pancreas Langerhans' islets were destroyed to reduce the insulin secretory capacity in order to prepare diabetic model rats. Rats with a blood glucose level of more than 300 mg/dl after one to two days from the administration of STZ were used as subjects of the experiment.

A plastic needle for administering insulin was inserted intramusculary at the thigh, then the head of the rat was fixed at the center of an RF probe, which was placed at the center of a superconductive magnet (inner diameter: 40 cm) of an MRI apparatus (made by SMIS Company).

After adjusting the monogeneity of the static magnetic field, measurements were performed once before administration of insulin (40 U/kg body weight) and immediately after administration and thereafter at intervals of 20 minutes for a period of two hours, with the use of MRI method of the present invention. The MRI method included the following imaging pulse sequence:

Constant magnetic field: 4.7 tesla;
Echo time (TE): 5 ms;
Repetition time (TR): 10 ms;
Number of excitataions (NEX): 4;
Field of views (FOV): 4 cm×4 cm;
Slice thickness: 3 mm;
Number of pixels: 128×128 pixels;
RF pulse: flip angle of between 45 and 60 degrees.

Figure 3:
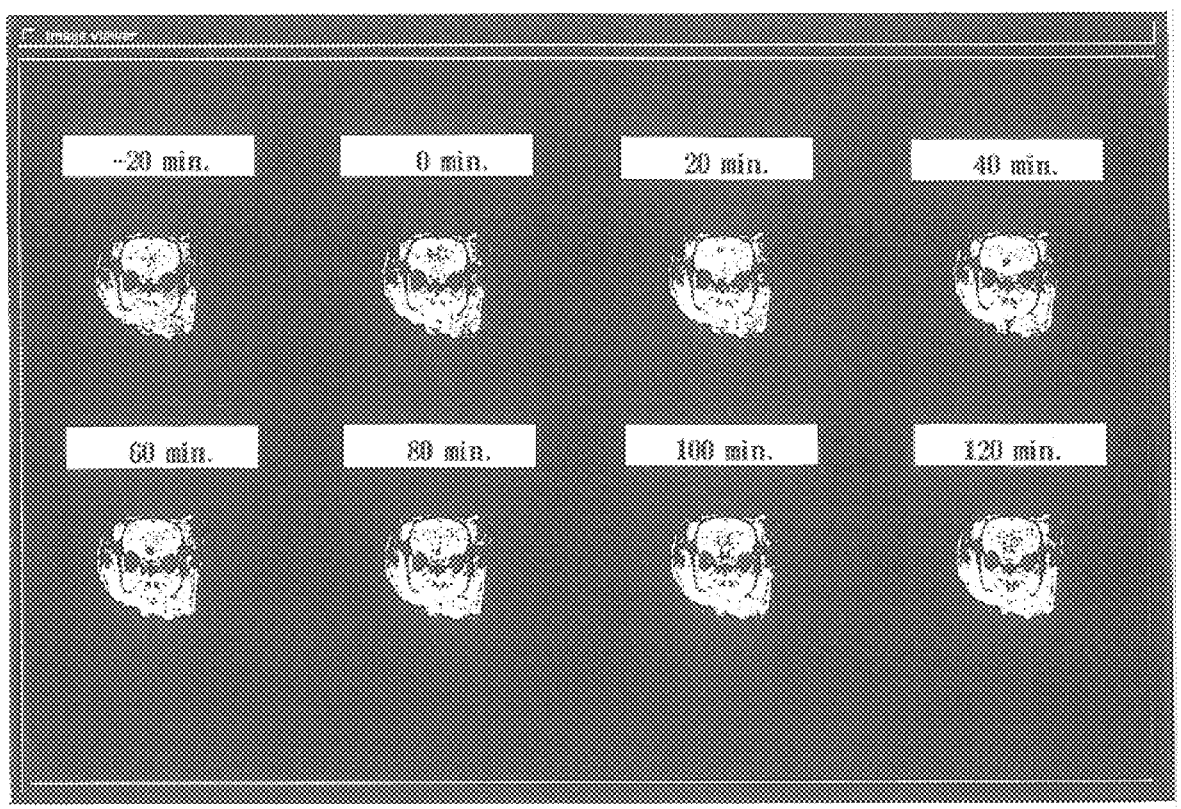
FIG. 3 illustrates an MRI representing changes in cerebral blood flow of a diabetic model animal after administration of insulin.

The results are shown in FIG. 3. More specifically, an apparent increase in signal intensity after the administration of insulin was observed in the hippocampus at 20 minutes, in the paraventricular nucleus of the hypothalamus (PVN) at 40 minutes, in the region containing the PVN and the dorsomedial nucleus of the hypothalamus (DMH) at 60 minutes, in the region containing the DMH and the ventromedial nucleus of the hypothalamus (VMH) at 100 minutes. At 120 minutes when the blood glucose level substantially recovered to the level before insulin administration, no change in signal intensity at a specific region was observed.

From the results as described above, it is confirmed that, when the glucose utilization in the peripheral tissues increases at a time in an animal in a glucose hunger state, some information from the peripheries are processed through a functional brain axis including the hippocampus, PVN, DMH, and finally VMH in this sequence. Therefore, in a diabetic patient in a glucose starvation state, similar to that of the model animal used in the present experiment, similar changes in signal intensity in the hippocampus, PVN, DMH and VMH would be expected to be observed by imaging changes in cerebral blood flow after administration of insulin by the application of the MRI method of the present invention.

What is claimed is:

1. A method of magnetic resonance imaging blood flow of a brain, said method comprising:

generating a rapid gradient-echo MRI pulse sequence, including an RF pulse, a slice gradient, a read gradient, and a phase-encode gradient, by providing said RF pulse with a flip angle of between 45 and 60 degrees, and by adding an additional gradient to each of said slice gradient, said read gradient, and said phase-encode gradient; and administering insulin and thereafter imaging, using said rapid gradient-echo MRI pulse sequence, changes in blood flow in at least one of the hippocampus, paraventricular nucleus of the hypothalamus, dorsomedial nucleus of the hypothalamus, and ventromedial nucleus of the hypothalamus of the brain.

2. A method of diagnosis of diabetes, comprising:

generating a rapid gradient-echo MRI pulse sequence, including an RF pulse, a slice gradient, a read gradient, and a phase-encode gradient, by providing said RF pulse with a flip angle of between 45 and 60 degrees, and by adding an additional gradient to each of said slice gradient, said read gradient, and said phase-encode gradient;

administering insulin and thereafter detecting, using said rapid gradient-echo MRI pulse sequence, an increase in blood flow in at least one of the hippocampus, paraventricular nucleus of the hypothalamus, dorsomedial nucleus of the hypothalamus, and ventromedial nucleus of the hypothalamus of the brain.

* * * * *